Figure 1:
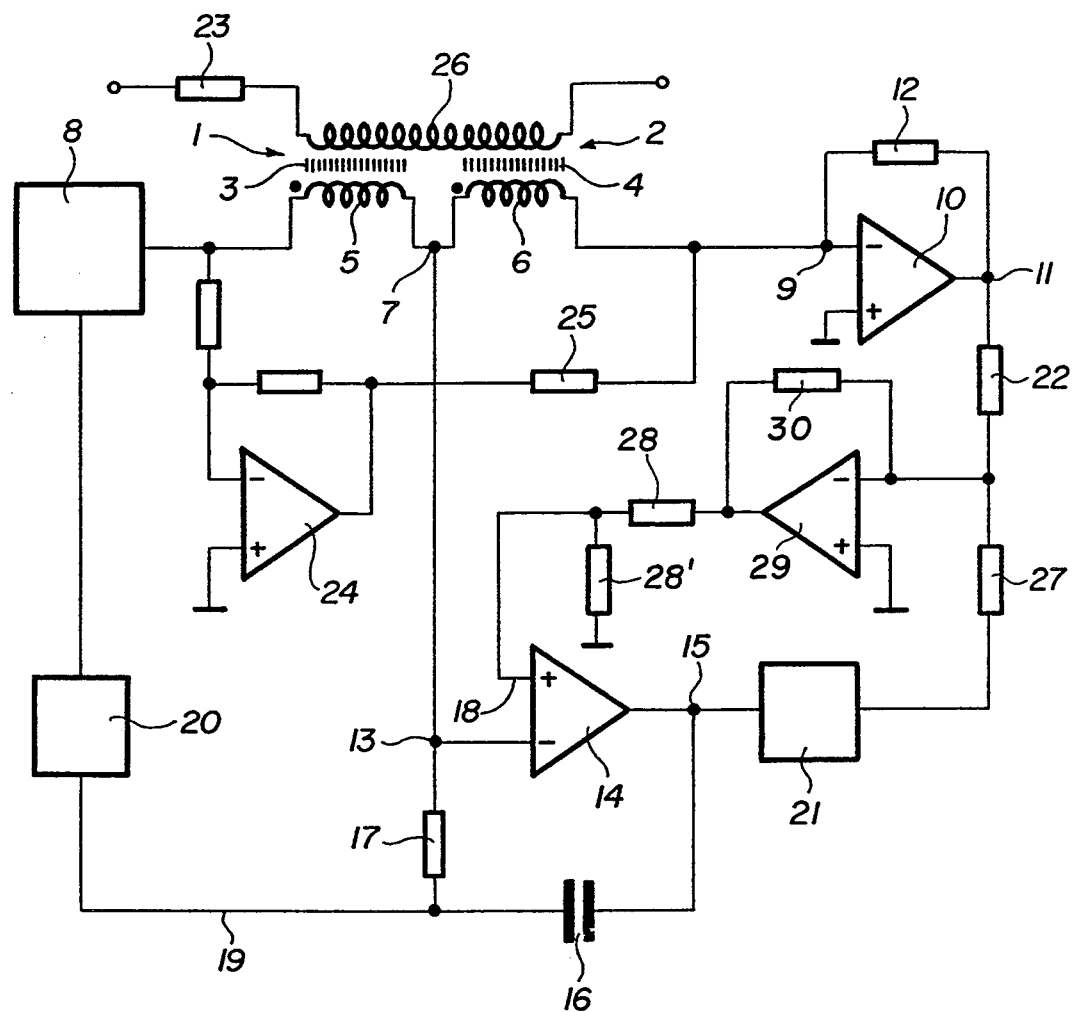

United States Patent [19]
Etter

[11] Patent Number: 5,345,169
[45] Date of Patent: Sep. 6, 1994

[54] CURRENT MEASURING DEVICE

[75] Inventor: Marcel Etter, Troinex, Switzerland

[73] Assignee: Liaisons Electroniques-Mecaniques LEM S.A., Plan-les-Ouates, Switzerland

[21] Appl. No.: 67,483

[22] Filed: May 24, 1993

Related U.S. Application Data

[63] Continuation of Ser. No. 834,447, Feb. 12, 1992, abandoned.

[30] Foreign Application Priority Data

Feb. 15, 1991 [CH] Switzerland ............................. 481/91

[51] Int. Cl.$^5$ ............................................ G01R 19/00
[52] U.S. Cl. .................................. 324/117 R; 324/127
[58] Field of Search ............... 324/117 R, 117 H, 126, 324/127, 250, 253; 336/212, 215; 323/356, 357

[56] References Cited

U.S. PATENT DOCUMENTS

| | | | |
|---|---|---|---|
| 3,714,544 | 1/1973 | Kelly, Jr. et al. | 324/117 R |
| 4,274,051 | 6/1981 | Condon | 324/117 R |
| 4,616,174 | 10/1986 | Jorgensen | 324/117 R |
| 4,899,103 | 2/1990 | Katzenstein | 324/117 R |
| 5,008,612 | 4/1991 | Otto | 324/117 R |

FOREIGN PATENT DOCUMENTS

0356248A1  2/1990  European Pat. Off. .

Primary Examiner—Vinh Nguyen
Attorney, Agent, or Firm—Woodard, Emhardt, Naughton Moriarty & McNett

[57] ABSTRACT

A current measuring device includes first and second current transformers, having each a magnetic core, a primary conductor or winding and a secondary winding coupled with the magnetic core, the primary windings or conductors being connected to carry the current to be measured. The secondary windings of the first and second transformers have an equal number of turns and are connected in series with each other, and arranged so that the currents induced in the secondary windings by the current to be measured flow in the same direction. A current generator has an output connected to the secondary winding of the first current transformer for feeding to the same a current comprising a magnetizing current component capable of driving the corresponding core, alternately, in opposite states of saturation. A device is provided for controlling the generator by the magnetizing current component, and measuring device are provided for measuring the current flowing in the secondary winding of the second current transformer, which is proportional to the current to be measured.

3 Claims, 1 Drawing Sheet

CURRENT MEASURING DEVICE

This application is a continuation of application Ser. No. 07/834,447, filed Feb. 12, 1992, now abandoned.

The present invention relates to a current measuring device of the type described in U.S. Pat. No. 5,008,612, the disclosure of which is made an integral part of this specification.

More particularly, the invention relates to a current measuring device comprising first and second current transformers, having each a magnetic core, a primary conductor or winding and a secondary winding coupled with said magnetic core, said primary windings or conductors being connected to carry the current to be measured. The secondary windings of the first and second transformers have an equal number of turns and are connected in series with each other, and arranged so that the currents induced in said secondary windings by the current to be measured flow in the same direction. A current generator has an output connected to said secondary winding of the first current transformer for feeding to the same a current comprising a magnetizing current component capable of driving the corresponding core, alternately, in opposite states of saturation. A device is provided for controlling said generator by the magnetizing current component, and measuring means are provided for measuring the current flowing in the secondary winding of the second current transformer, which is proportional to the current to be measured.

In a current measuring device of the above type, it is desired to separate the magnetizing current component and the current component used for measuring the current flowing in the primary conductor. It is further desired to compensate other influences affecting the measure, such as the voltage drop in the secondary winding of the second current transformer and the variation of the offset voltages of the amplifiers used in the device.

Various means have been proposed to improve the performances of such current measuring devices, but they appear unable to provide sufficient separation or compensation and appear to be extremely difficult to control and to adjust, which makes the same inappropriate for a series manufacture and for use in a relatively broad range of temperatures.

It is a main object of the present invention to provide a current measuring device of the above mentioned type allowing to obtain a measuring signal exempt of any remains of the magnetizing current and of any variations due to the same, and further allowing to compensate, automatically and with a minimum of adjustment, other influences affecting the measuring signal.

According to the invention, compensating means are provided for compensating any variations of potential due to the magnetizing current component at a common connection point of the series-connected secondary windings of the measuring device, and biasing means for biasing said connection point are provided so as to compensate the voltage drop produced by the current flowing in the secondary winding of the second current transformer, and so as to compensate offset voltages of amplifiers of said measuring compensating and biasing means.

Further aspects and objects of the present invention will become apparent from the following description given by way of example of a particular embodiment thereof, and in which reference is made to the accompanying drawing, in which:

FIG. 1 is a simplified electrical diagram of a current measuring device according to the invention.

In the diagram of FIG. 1, references 1 and 2 indicate two current transformers having respective magnetic cores 3 and 4, for example toroidal cores of a material having high magnetic permeability. These transformers comprise a primary winding, for example a common winding 26, or a common primary conductor coupled with the two cores and carrying the current $I_p$ to be measured. The secondary windings of each of the transformers are indicated, respectively, by references 5 and 6. These windings have a common connection point 7 and are wound so that the primary current induces therein currents which flow in the same direction in the series connection of these windings.

An alternately positive and negative voltage is applied to the winding 5 by a generator 8, the corresponding current magnetizing the core 3 and being capable of driving the same cyclically into forward and reverse states of saturation. Furthermore, the measuring current related to the primary current is provided by generator 8 and superposed to the magnetizing current.

The terminal of winding 6, which is not connected to the common connection point 7, is coupled to the negative input 9 of an amplifier 10, the output 11 of which is coupled through a resistor 12 having the value R to the same input 9. The positive input of amplifier 10 is connected to ground.

The secondary windings 5 and 6 have the same number of turns $N_s$, the number of turns of the primary winding being $N_p$. Under the conditions to be fulfilled in the present device, in particular under the condition that no part of the magnetizing current component flowing in the winding 5 enters the winding 6, the voltage U appearing at the output 11 of the amplifier has the value $$U = I_p \cdot R \cdot N_p / N_s.$$

This voltage, which is proportional to the primary current, thus represents a measuring signal.

According to a first improvement of the above device, the common connection point of secondary windings 5 and 6 is connected to a negative input terminal 13 of an amplifier 14, and the output 15 of that amplifier is coupled through the series connection of a condensor 16 and a resistor 17 to the input terminal 13. A biasing potential, obtained as described below, is applied to a second, positive, input 18 of the amplifier 14.

The capacitive coupling between the output 15 and the input 13 of amplifier 14 maintains the potential of point 7 substantially at a value which is independent of the variations due to the magnetizing current component. Accordingly, the magnetization current component flows entirely in the circuit portion 7, 13, 17 and does not enter the winding 6. The voltage appearing across resistor 17 is applied through a connection 19 and a control device 20 for controlling the generator 8. The control consists in triggering a reversal of the output voltage of the generator each time saturation is reached in the core 3, in other words, each time the voltage drop over resistor 17 reaches predetermined positive and negative thresholds.

The biasing potential at the input 18 of amplifier 14 is derived, on the one hand, from the output signal of that amplifier, which signal is first filtered in a low-pass filter 21 and then applied with inverse polarity, through a resistor 27, an inverter 29, 30 and a resistor circuit 28 to the input 18. This negative feed-back loop of the amplifier 14, which acts on the input 18, is dimensioned so as to prevent the output voltage of the amplifier from reaching the saturation threshold of said amplifier. The biasing potential at input 18 is derived, on the other hand, from the measuring signal appearing at the output terminal 11 of amplifier 10. This output signal is added through a resistor 22 to the signal provided by the amplifier 14. The resistor 22 is calculated, in particular, so as to compensate the voltage drop in the secondary winding 6 of transformer 4, any variation of said voltage drop producing immediately a corresponding variation of the biasing potential at the input 18. The biasing potential at the input 18 also compensates the offset voltages of amplifiers 10 and 14.

In case the present device, which provides electrical isolation of the measuring circuit, is used to measure voltages, a resistor 23 is connected in series with the primary winding 26 in the primary circuit of transformers 1 and 2. The primary winding has in this application a relatively high number of turns as compared to the case of a pure current measuring. Furthermore, a signal is derived from the output of the generator 8 and is applied through an inverter 24 and a calibrating resistor 25 to the input 9 of amplifier 10. The different resistors are calculated so that the effect of the current induced in the primary winding 26 by the variations of the voltage of generator 8 applied to the winding 5, is compensated by a current of opposite sign provided by the circuit 24, 25. This allows to eliminate the influence of an undulation of the primary current on the measuring signal at the output 11 of amplifier 10, such an undulation of the primary current being due to the magnetization of transformer 1.

I claim:

1. A current measuring device comprising first and second current transformers having each a magnetic core, a primary conductor or winding and a secondary winding coupled with said magnetic core, said primary windings or conductors being connected to carry a current to be measured, said secondary windings of said first and second transformers having an equal number of turns and being connected in series with each other and arranged so that the currents induced in said secondary windings by the current to be measured flow in the same direction, a current generator having an output connected to said secondary winding of said first current transformer for feeding to the same a current comprising a magnetizing current component capable of driving the corresponding core alternately into opposite states of saturation, a device for controlling said generator by the said magnetizing current component, current measuring means connected to said secondary winding of said second current transformer for measuring the current flowing in said secondary winding, compensating means comprising an operational amplifier a first input of which is connected to a common connection point of said series-connected secondary windings, a biasing potential being applied to a second input of said amplifier by coupling said second input through a negative feed-back loop including the series connection of a low-pass filter and an inverter with the output of said amplifier, the output of said amplifier being further coupled with said first input thereof through a series connection of a condenser and a resistor, so as to maintain the potential of said common connection point substantially constant with respect to variations of said magnetizing current component.

2. A current measuring device according to claim 1, wherein the common connection point of said resistor and said condenser is coupled with the input of said device for controlling said current generator.

3. A current measuring device according to claim 1, wherein said second input of said amplifier of said compensating means is further coupled with said output of said current measuring means.

* * * * *